(12) United States Patent
Xu et al.

(10) Patent No.: US 9,217,779 B2
(45) Date of Patent: Dec. 22, 2015

(54) METHOD AND SYSTEM FOR OBTAINING DEGRADATION OF BATTERY USING DEGRADATION MODEL AND PARAMETERS RELATED TO THE DEGRADATION

(71) Applicant: PANASONIC CORPORATION, Osaka (JP)

(72) Inventors: Ming Xu, Beijing (CN); Xiaofei Zhang, Bejing (CN); Yasuhiro Nakamura, Osaka (JP); Frank Zhao, Beijing (CN); Ning Chen, Shanghai (CN); Yoshimasa Goto, Osaka (JP)

(73) Assignee: PANASONIC CORPORATION, Osaka (JP)

( * ) Notice: Subject to any disclaimer, the term of this patent is extended or adjusted under 35 U.S.C. 154(b) by 231 days.

(21) Appl. No.: 13/686,052

(22) Filed: Nov. 27, 2012

(65) Prior Publication Data

US 2013/0085696 A1    Apr. 4, 2013

Related U.S. Application Data

(63) Continuation of application No. PCT/CN2010/000937, filed on Jun. 24, 2010.

(51) Int. Cl.
*G01R 31/36* (2006.01)
*G06F 17/40* (2006.01)
(Continued)

(52) U.S. Cl.
CPC ............... *G01R 31/3624* (2013.01); *B60L 3/12* (2013.01); *B60L 11/1857* (2013.01); *G01R 31/3606* (2013.01); *G01R 31/3651* (2013.01); *G01R 31/3679* (2013.01); *G06F 17/40* (2013.01); *H04Q 9/00* (2013.01); *H04Q 2209/43* (2013.01);
(Continued)

(58) Field of Classification Search
CPC .......... G01R 31/3624; G01R 31/3606; G01R 31/3651; G01R 31/3679; G06F 17/40; B60L 3/12; B60L 11/1857; H04Q 9/00; H04Q 2209/43; H04Q 2209/47; H04Q 2209/84
USPC ......... 702/57, 63–65; 320/128, 132, 135, 160
See application file for complete search history.

(56) References Cited

U.S. PATENT DOCUMENTS

| | | | |
|---|---|---|---|
| 5,596,260 A * | 1/1997 | Moravec et al. ............. | 320/135 |
| 7,317,995 B2 | 1/2008 | Quint et al. | |

(Continued)

FOREIGN PATENT DOCUMENTS

| | | |
|---|---|---|
| CN | 1797837 A | 7/2006 |
| CN | 2932508 Y | 8/2007 |

(Continued)

OTHER PUBLICATIONS

Japan Office action, mail date is Jul. 1, 2014.
(Continued)

*Primary Examiner* — Manuel L Barbee
(74) *Attorney, Agent, or Firm* — Greenblum & Bernstein, P.L.C.

(57) ABSTRACT

The present disclosure provides a method for obtaining degradation of a battery comprising the steps of collecting data of the battery and data related to the degradation of the battery; processing the collected data to obtain parameters related to the degradation of the battery; creating and updating a degradation model for the battery with the obtained parameters; and computing the degradation of the battery by using the degradation model and the parameters.

3 Claims, 10 Drawing Sheets

(51) Int. Cl.
  *B60L 3/12*    (2006.01)
  *B60L 11/18*   (2006.01)
  *H04Q 9/00*    (2006.01)

(52) U.S. Cl.
  CPC ........ *H04Q 2209/47* (2013.01); *H04Q 2209/84* (2013.01); *Y02T 10/7005* (2013.01); *Y02T 10/705* (2013.01)

(56) References Cited

U.S. PATENT DOCUMENTS

| | | | |
|---|---|---|---|
| 7,576,517 | B1 * | 8/2009 | Cotton et al. ................. 320/136 |
| 8,306,781 | B2 | 11/2012 | Xu et al. |
| 8,615,372 | B2 | 12/2013 | Tomura et al. |
| 2003/0069704 | A1 * | 4/2003 | Bean ............................... 702/63 |
| 2005/0001627 | A1 | 1/2005 | Anbuky et al. |
| 2005/0083017 | A1 * | 4/2005 | Suzuki ........................... 320/128 |
| 2005/0168226 | A1 | 8/2005 | Quint et al. |
| 2007/0029974 | A1 | 2/2007 | Uchida |
| 2007/0236183 | A1 * | 10/2007 | Darilek ........................... 320/132 |
| 2008/0150491 | A1 | 6/2008 | Bergveld et al. |
| 2008/0249724 | A1 | 10/2008 | Jin et al. |
| 2010/0030498 | A1 | 2/2010 | Kimura et al. |
| 2010/0256935 | A1 | 10/2010 | Imanishi et al. |
| 2011/0054815 | A1 | 3/2011 | Xu et al. |
| 2011/0161025 | A1 | 6/2011 | Tomura et al. |

FOREIGN PATENT DOCUMENTS

| | | |
|---|---|---|
| CN | 101031810 A | 9/2007 |
| CN | 101067644 | 11/2007 |
| CN | 100483146 | 4/2009 |
| CN | 101558320 | 10/2009 |
| JP | 2006-197765 | 7/2006 |
| JP | 2007-74891 | 3/2007 |
| JP | 2008-96140 | 4/2008 |
| JP | 2009-128250 | 6/2009 |
| JP | 2010-60384 | 3/2010 |
| WO | 2006/090636 | 8/2006 |
| WO | 2010/026930 | 3/2010 |

OTHER PUBLICATIONS

Xu, "Lithium Ion Battery Lifespan Prediction Model", Journal of Applied Sciences, vol. 24, No. 4, pp. 368-371, Jul. 2006.
Meng et al., "Cycle Life Prediction of Power Battery", vol. 33, No. 11, pp. 955-969, Nov. 2009.
Li, "Cycle-life prediction model studies of lithium-ion batteries", vol. 32, No. 4, pp. 242-246, Apr. 2008.
Gao et al., "Research progress on lithium-ion power battery life prediction", vol. 28, No. 6, pp. 79-83, Jun. 2009.
Search report from WIPO International Bureau, mail date is Mar. 31, 2011.
Japan Office action, mail date is Feb. 5, 2013.
International Preliminary Report on Patentability for PCT/CN2010/000937, mailed Jan. 10, 2013.
China Office action with a mail date of Aug. 28, 2014, along with an English language translation.

* cited by examiner

METHOD AND SYSTEM FOR OBTAINING DEGRADATION OF BATTERY USING DEGRADATION MODEL AND PARAMETERS RELATED TO THE DEGRADATION

This is a continuation application based on PCT application No. PCT/CN2010/000937 as filed on Jun. 24, 2010, which claims no priority.

BACKGROUND OF THE INVENTION

1. Field of the Invention

The present disclosure relates to a method and system for obtaining the degradation of a battery, and a secondary battery operation system based on the method and system.

2. Description of the Related Art

Energy conservation and environment protection have now drawn attentions from various industries and businesses. Many countries focus on vehicles using new energy sources as the development of automobile industry. Compared with conventional vehicles with internal combustion engines, vehicles using new energy sources have advantages in saving traditional resources, protecting environment and the like. EVs (electric vehicles) are one of the choices. However, it is difficult to put EVs into market due to low energy density and long charging time for batteries. For example, a lithium ion battery currently has an energy density of about 150 wh/kg, while the energy density for gasoline is 10000 to 12000 wh/kg. Further, it is difficult to charge a battery to fullness in a short time. Currently, it usually takes about 3 to 5 hours to charge a battery to its full capacity. Most of users can hardly accept such long charging process, unless this charging is carried out in their houses. Even a quick non-saturated charging process, it may take about 30 minutes. A battery is usually expensive. The price of a lithium ion battery with unit capacity is around 0.5 to 1.00 dollar/wh. Battery cost for a car will be from thousand to tens of thousand dollars. There is also security requirement for EV battery. Since EV battery has an energy storing capacity much larger than a built-in battery for a mobile device, and also a higher risk of being impacted, squeezed, or suffering high temperature in some extreme conditions, the battery has higher security requirement, and this further adds the cost of EV battery.

The above problems for batteries may be ultimately solved with progress of battery technology. However, in a short period, it is still difficult to address the problems, such as slow charging process and higher cost.

In view of the problems like long charging time and high cost, some BOMs (battery operation models) have been introduced. One of the BOMs is replacing batteries instead of charging them. It may take only one or two minutes to replace a battery pack. Another BOM associated with battery replacement is battery rental. An owner of an EV does not have to purchase expensive batteries. Instead, he or she may rent EV battery, and this may considerably reduce the initial cost for buying an EV. A further BOM is a life-time efficient utilization of a battery, and indirectly reduces cost during use of the battery. For example, when an EV battery degrades in performance and thus its capacity decreased to a certain ratio (e.g., 80%) of its rated capacity, this battery may be used as accumulator battery for household or business facilities. The battery may be recycled if the battery capacity further decreases to a certain level. A yet further model is to circulate or exchange EV batteries among automobile owners, and thus to reduce cost for maintaining or using the battery.

A method for obtaining degradation or residual life time of a battery is to obtain the degradation through battery charge and discharge experiments. This method requires full charge of a battery and then rapid discharge. It takes a long time and detrimental to the battery. Thus, this method is not suitable for battery operation.

PCT International publication No. WO 2006/090636 A1 discloses the battery exchange scheme which is primarily applied to mobile terminals.

Japan patent laid-open publication No. JP 2007-074891 A discloses conventional methods for estimating degradation of an EV battery take into account influences on the degradation from different vehicle models (vehicle weight, equipments of electric devices, such as in-vehicle air condition), different road conditions, and external environment.

SUMMARY OF THE DISCLOSURE

In view of the above problems, the present disclosure relates to methods and systems for obtaining degradation of a battery in an accurate way. The methods and systems use degradation-based parameters to update a degradation model and use the updated model in estimation, thereby obtaining a highly accurate estimate of the degradation.

According to an aspect of the present disclosure, a method for obtaining degradation of a battery is provided comprising the steps of collecting data of the battery and data related to the degradation of the battery; processing the collected data to obtain parameters related to the degradation of the battery; creating and updating a degradation model for the battery with the obtained parameters; and computing the degradation of the battery by using the degradation model and the obtained parameters related to the degradation.

These general and specific aspect may be implemented using a system, a method, a computer program, and any combination of systems, methods, and computer programs.

According to the present disclosure, there may be some error because certain mathematical derivation model may be used in model updating on the basis of initial degradation. Accordingly, the present disclosure also provides methods for calibrating a degradation model.

BRIEF DESCRIPTION OF THE DRAWINGS

These and other objects and features of the present disclosure will become clear from the following description taken in conjunction with the preferred embodiments thereof with reference to the accompanying drawings throughout which like parts are designated by like reference numerals, and in which.

DETAILED DESCRIPTION OF THE PREFERRED EMBODIMENTS

Hereafter, embodiments of the present disclosure will be described in detail with reference to the figures. Description of details and functions not essential to the present disclosure is omitted to avoid obscuring the present disclosure.

The EV battery may be designed into standard battery pack having a smaller capacity. An EV may be equipped with a certain number of such standard battery packs depending on requirements. The capacity of a standard battery pack may be determined upon battery capacity required for traveling a distance in daily usage. Currently, an EV often has only one battery pack (bank), and battery replacement is actually replacement of the one battery pack (bank).

The above models are confronted with a problem, i.e., a technique or method is needed to accurately learn the degree that the battery has degraded. In other words, it is necessary to accurately determine the residual life time of a battery, and evaluate rental or circulation of the battery based on its residual life time.

Furthermore, during rental and use of the battery for mobile terminals, how many times that the battery has been charged and how long that the battery has been used can be used as two parameters to deduce the residual capacity of the battery, and thus determine the charge for renting the battery. The batteries for mobile terminals, such as mobile phone, are used in a stable environment and fixed manner. As a result, the numbers of times for charging the battery and its use time can substantially reflect the degradation of the battery. This is not the case for EV batteries. The degradation of a battery will present different characteristics due to differences in conditions of traveled roads, season or weather conditions, users' driving habits, in-vehicle electronics and usage conditions.

Figure 4:
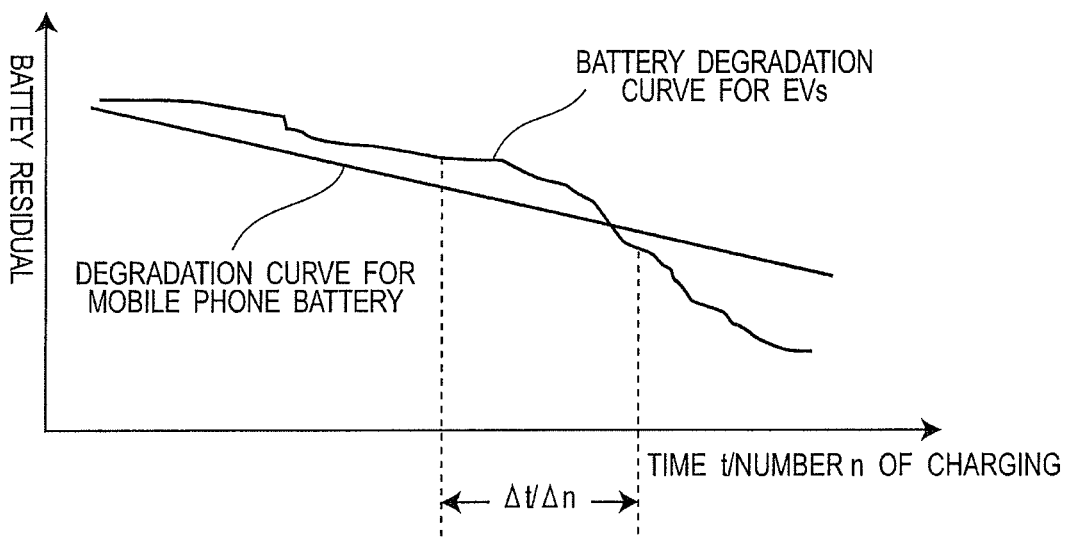
FIG. 4 shows schematically degradation curves of a battery for mobile terminals and a battery for EVs of a comparative example.

FIG. 4 is a schematic graph showing degradation curves of a battery for mobile terminals and a battery for EVs of a comparative example. As shown in FIG. 4, the horizontal axis represents a battery's usage time or the number of times for charging the battery, and the vertical axis represents residual value of the battery's capacity. FIG. 4 shows that the degradation curve of the battery for mobile terminals is linear, and thus it is possible to deduce the degradation of such a battery based on the times that the battery has been charged or the time that the battery has been used. On the other hand, the degradation curve of the battery for EVs is uncertain and non-linear with respect to the times that the battery has been charged or the time that the battery has been used. As a result, it is impossible to accurately estimate the degradation of the battery based on the charging frequencies or the usage time.

Now preferred embodiments of a system for obtaining degradation of a battery according to the present disclosure will be described. It will be appreciated that the present disclosure is not limited to these specific embodiments, and various combinations of the systems and its applications may be envisioned depending on different situations without departing from the idea of the present disclosure. In an preferred embodiment, the system for obtaining degradation of a battery according to the present disclosure may include the following subsystems interacting with each other:

1) parameter collection subsystem for battery degradation factors;

2) creation and update subsystem for battery degradation model;

3) computation subsystem for battery degradation; and

4) DCL storage subsystem for parameters related to battery degradation.

The system for acquiring battery degradation according to the present disclosure may further include:

5) degradation model calibration system, and/or 6) data application subsystem based on battery degradation.

Figure 1:
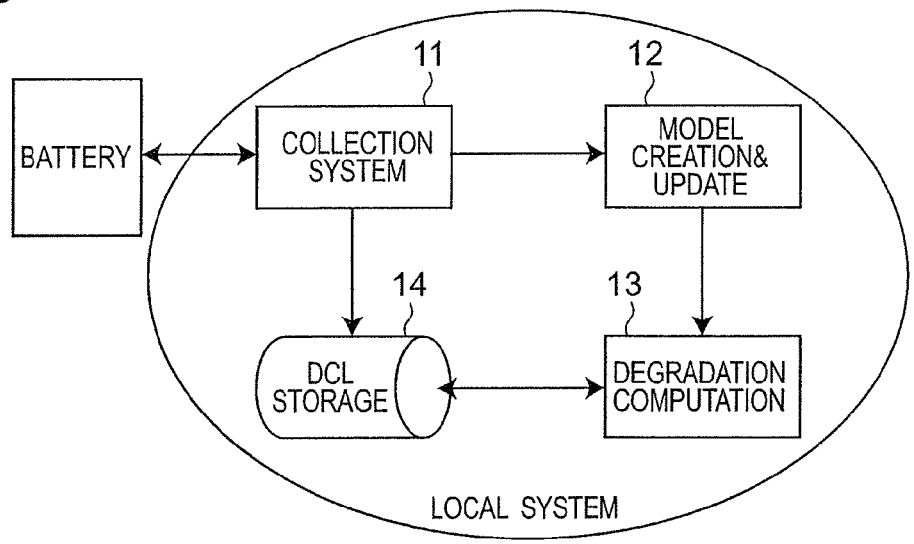
FIG. 1 shows a basic block diagram of a system for obtaining degradation of a battery according to an embodiment of the present disclosure.

FIG. 1 shows a basic block diagram of the system for obtaining degradation of a battery according to an embodiment of the present disclosure. In this embodiment, the system includes a collection subsystem 11 connected to a battery system, a model creation and update subsystem 12, a degradation computation system 13 and a DCL (Degradation Condition Log) storage subsystem 14. The collection subsystem 11 for collecting parameters related to degradation may couple to the battery system, and may collect various data of the battery from the battery or its management system, and transmit information, such as degradation data, to the battery system. The collection subsystem 11 may process the collected raw data related to the battery and additional data to obtain parameters related to degradation, and transmit the obtained or processed data to the model creation and update subsystem 12. The collection subsystem 11 may also store the collected and processed data in the DCL storage subsystem 14. The degradation computation system 13 may couple to each of the DCL storage subsystem 14 and the model creation and update subsystem 12, retrieve degradation-related parameters and updated degradation model from these subsystems, compute battery degradation and then transmit the computation result to the DCL storage subsystem for storage. Various data and parameters of a battery may be stored in a DCL as history data of the battery.

Figure 2:
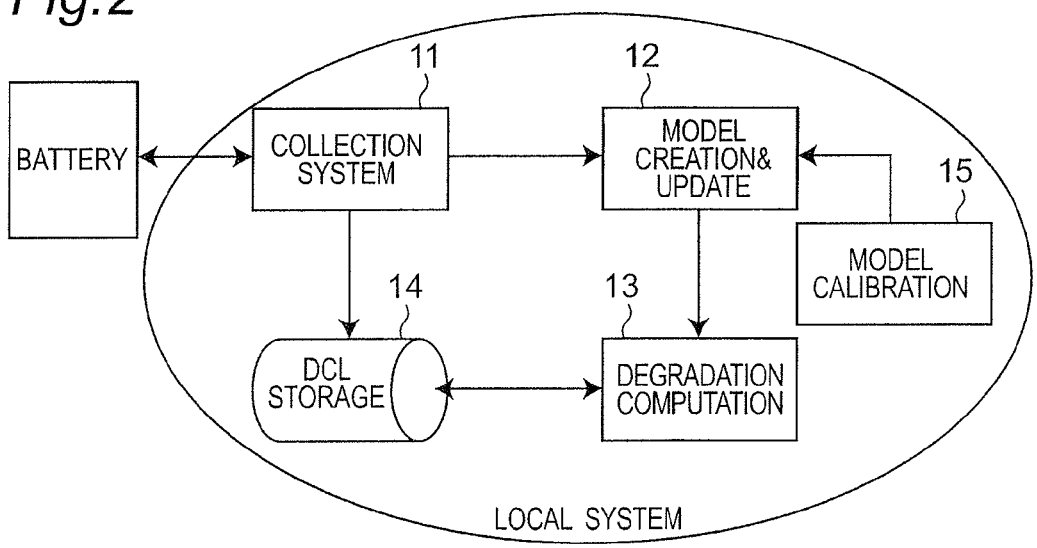
FIG. 2 shows a block diagram of the system of FIG. 1 incorporated with a degradation model calibration module.

FIG. 2 is a block diagram showing the system of FIG. 1 incorporated with a degradation model calibration module 15. For example, the degradation model calibration module 15 may utilize battery charge-discharge cycle experiments or other approaches to obtain basic data for a battery. The degradation model calibration module 15 may create an initial degradation model for the battery or update and calibrate an existing degradation model based on degradation values actually measured on the battery and collected parameters related to the degradation. Further, the degradation model calibration module 15 may update and calibrate the part of the degradation model which is obtained through non-real measurement, such as mathematical calculation, based on the obtained data of the battery, so that the model closer to real situations and make degradation data obtained through the model more accurate.

Figure 3:
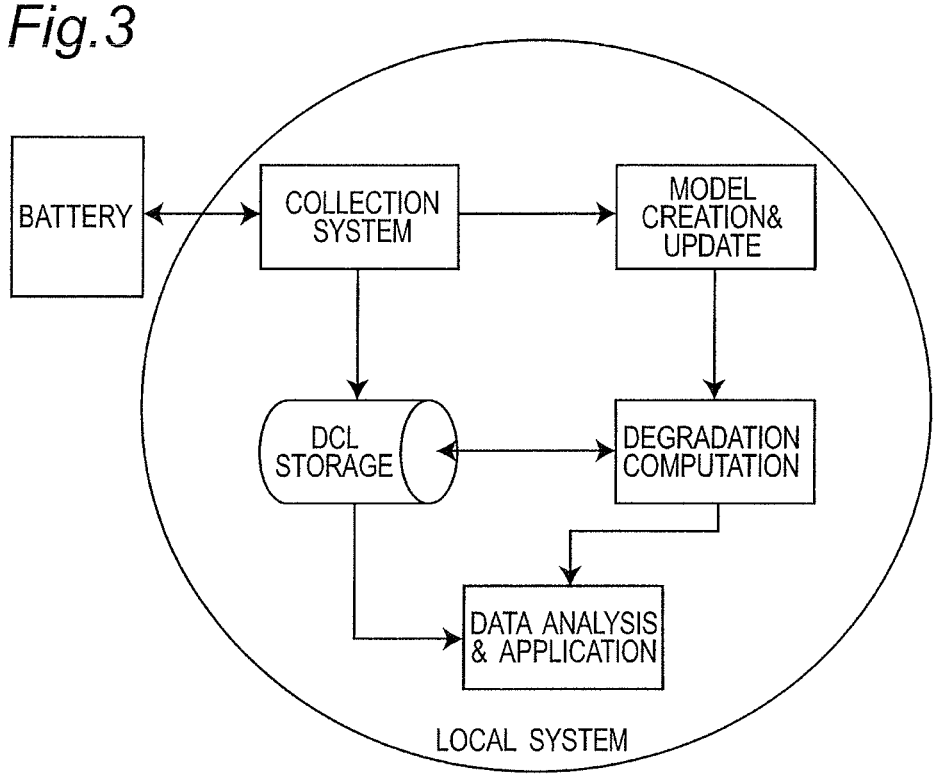
FIG. 3 shows a block diagram of the system of FIG. 1 incorporated with a data analysis and application module.

FIG. 3 is a block diagram showing the system of FIG. 1 incorporated with a data analysis and application module 16. The data analysis and application module 16 may analyze data including DCL data, degradation-related parameters and degradation computation results, and provide the analysis result to an external system for further use.

Figure 6:
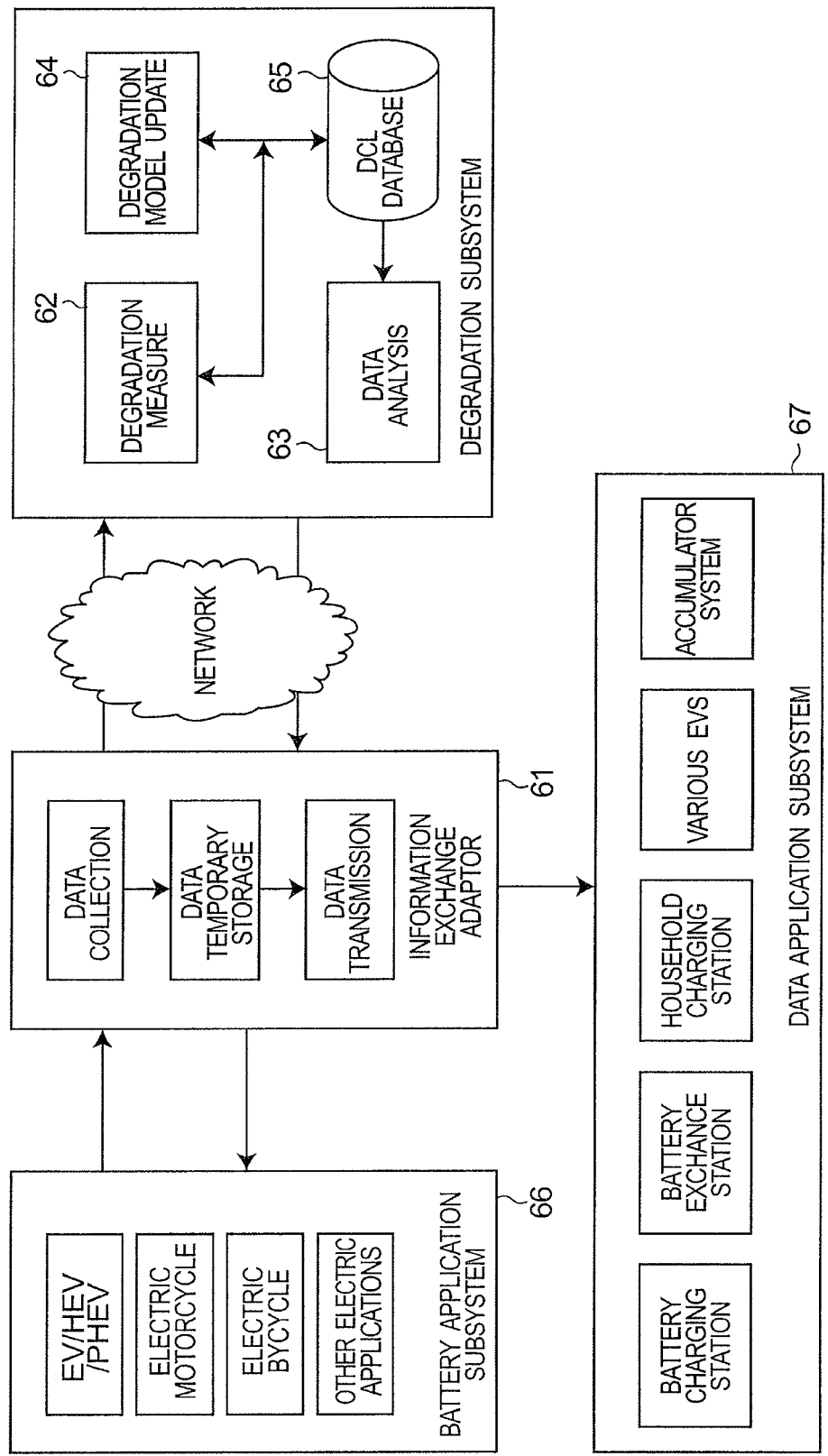
FIG. 6 shows a block diagram of a system for obtaining degradation of a battery according to the present disclosure combined with another system according to a preferred embodiment.

FIG. 6 is a block diagram showing an embodiment in which the system for obtaining battery degradation and respective subsystems are integrated. Compared with the structures of the three systems shown in FIGS. 1-3, the embodiment of FIG. 6 differs in arrangement of the subsystems. In the embodiment of FIG. 6, the system for obtaining battery degradation and the respective subsystems, as a whole, may include an information exchange adaptor 61, a degradation measurement unit 62, a data analysis unit 63, a degradation model creation and update unit 64, a DCL database 65, a battery application subsystem 66, and a data application subsystem 67. As shown in FIG. 6, the information exchange adaptor 61 couples to the battery application subsystem 66, and may collect and temporarily store parameters related to battery degradation. Here, the battery application subsystem may include various occasions where a battery is used, such as electric vehicle, electric motorcycle, electric bicycle, and so on.

In FIG. 6, the information exchange adaptor 61 and the battery application subsystem 66 may form the parameter collection subsystem for battery degradation factors. The parameter collection subsystem may acquire DCL data from one or more battery packs or from other associated controllers, and transmit the acquired DCL data to degradation computation subsystem over a transmission network. The parameter collection subsystem also may temporarily store computation results from the degradation computation subsystem for further use. For more details, reference may be made to "methods for establishing a battery degradation model and degradation parameter collection subsystem."

Transmission lines between the parameter collection subsystem and the other units may form a transmission network for parameters of battery degradation factors. The transmission network may transmit DCL data, degradation-related parameters and respective time parameters and the like for a battery. The degradation model creation and update unit 64 and the DCL database 65 may form the creation and update subsystem for battery degradation model. The degradation model creation and update unit 64 may create and update an initial degradation model which may be a model for degradation computation and created from battery data obtained through experiments. An updated degradation model may be automatically created based on the initial model and actual battery DCL data, which may be called updating of the degradation model. With an increase in amount of battery degradation data, computation of the degradation model may become more accurate, and thus the battery degradation data may be computed with higher accuracy. Detailed operation process of the degradation model creation and update unit 64 may be referred to "creation and update subsystem for battery degradation model."

The degradation measurement unit 62 and the data analysis unit 63 may form the computation subsystem for battery degradation. The degradation measurement unit 62 may compute particular degradation data based on the degradation model, battery DCL data retrieved from the DCL database, and parameters directly acquired from the collection subsystem. When obtaining particular battery DCL data, the degradation measurement unit 62 may use the data as parameters to compute degradation data for the battery based on the updated degradation model provided by the creation and update unit 64, and provide the computation result to the DCL database for storage. More details of degradation computation methods may be referred to "computation subsystem for battery degradation."

The data analysis unit 63 may serve the degradation data application subsystem as described in the following. The data analysis unit 63 may analyze "DCL data" from the DCL database, data related to battery degradation, processed parameters related to battery degradation and corresponding degradation data, obtain parameters, such as the relationship between charging current and degradation data of a battery, interested by the external data application subsystem, and provide the analysis result to the external data application subsystem. In FIG. 6, the data application subsystem based on battery degradation couples to the information exchange adaptor 61 via the transmission network. The data application subsystem may receive and utilize data temporarily stored in a temporary data storage in the information exchange adaptor 61. For example, the data application subsystem may determine an optimal manner for driving vehicles, an optimal manner for changing the battery, and so on based on the degradation data stored in the temporary data storage. Details may be found in "data application subsystem based on battery degradation."

Figure 5:
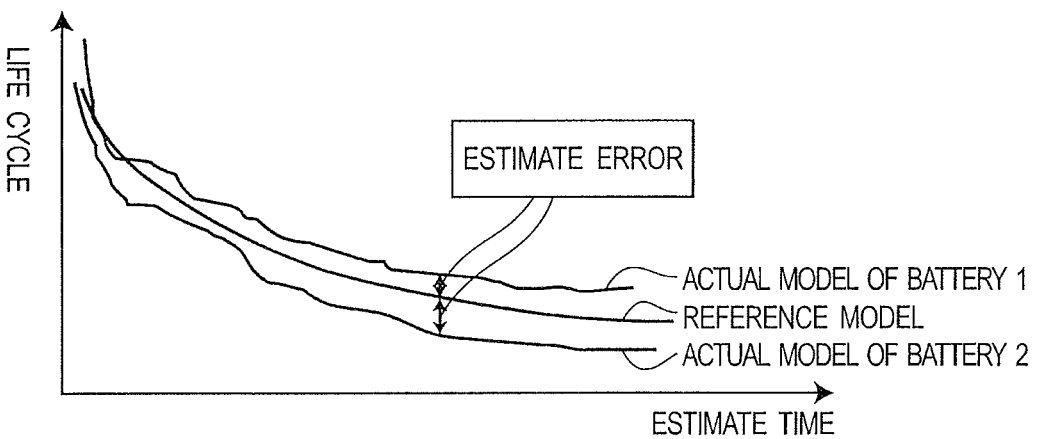
FIG. 5 is a schematic diagram showing differences in degradation curves of individual batteries.

Conventional methods for estimating degradation of an EV battery take into account influences on the degradation from different vehicle models (vehicle weight, equipments of electric devices, such as in-vehicle air condition), different road conditions, and external environment. The methods measure these factors in some typical conditions, and accordingly estimate and save the degradation estimates of the battery during a test stage. Then, during the stage of actual estimation of battery degradation, the degradation is determined by looking up a database in which the above factors and estimates of degradation are stored to find the closest factors and then the closest estimate. These methods estimate degradation of batteries by establishing a database storing a limited number of degradation data. However, during the daily use of an EV, the actual values for these factors cannot be the same as the factors stored in the database. This leads to deviation of a degradation estimate obtained from the database from the actual degradation of the batteries. FIG. 5 shows that degradation curves of individual batteries are different from each other. The actual degradation patterns are different for individual batteries and also from the reference pattern, as shown in FIG. 5.

In real applications, degradation in a battery's performance results from various factors. For example, charging and discharging, using or disposal of a battery may influence the battery's degradation. Different types of batteries, such as lead-acid battery, nickel-hydrogen battery, or lithium battery, have different degradation characteristics. Generally, a basic degradation model is used to describe degradation characteristics of each type of batteries based on research and experiments with respect to this type. The initial degradation model established for a particular type of batteries can only reflect an average of degradation characteristics, and may have significant errors with respect to actual degradation characteristics of an individual battery, as shown above in FIG. 5.

The system for obtaining battery degradation according to preferred embodiments of the present disclosure may automatically create an updated degradation model which can accurately reflect degradation characteristic of an individual battery, by using an existing initial degradation model of the battery and by employing techniques such as data prediction, updating and calibration, etc.

The present disclosure may includes several parts including creation of an initial degradation model, generation of an updated degradation model, obtaining of degradation, utilization of degradation data, and so on. Each part may include respective methods and subsystems. As an example, the present disclosure can be implemented by using an battery degradation measurement device built-in vehicle, or a separate battery degradation measurement device. The disclosure can also be implemented by using a networked battery degradation measurement system, or a mixed measurement system of a network and a measurement device.

Each part of the present disclosure may be implemented with respective subsystems. The collection subsystem collects battery data including various parameters related to battery degradation, performs necessary pre-processing on the collected data, and then transmits the data to the subsystem for computing battery degradation. A preset degradation model may be used in computing the battery degradation. To obtain a more accurate computation result, the degradation model may be extended, updated and/or corrected. Based on the computed battery degradation, respective manipulations can be conducted on the battery and devices using the battery, or provide related information to the devices, thereby meeting requirements of the battery or the device in a more efficient way.

In the present disclosure, the number of standard battery packs may be flexibly configured, and part or all of the standard battery packs may be flexibly replaced or changed. Such battery packs are called FBP (Flexible Battery Pack) in the present disclosure. Using the FBPs may lead to effective reduction in initial cost for purchasing an electric vehicle, and thus facilitate popularization of electric vehicles. Combination of FBP and battery rental operation model may lead to further reduction in cost for daily use of electric vehicles.

Here the battery may be used in various forms, such as in a pure electric automobile, a gas-electricity hybrid automobile, a plug-in hybrid automobile, a distance extended electric automobile, an electric bicycle, an electric motorcycle, and so on. The battery here may have various composition forms, such as a fixed battery pack for which replacement or expansion of part of the battery pack cannot be conduct, or a FBP which may be flexibly extended, exchanged, used and controlled. Meanwhile, the battery here may be a battery used for non-power-driven applications, such as accumulator batteries for storing electric power.

Now description will be given to respective methods and subsystems for implementing the system for obtaining battery degradation according to the present disclosure.

1. Methods for creating a battery degradation model and Degradation parameter collection subsystem Degradation of an EV battery may result from interactions of various factors. To accurately compute degradation of the battery, it is necessary to record parameters for respective degradation factors, and determine the degradation based on values of these parameters. The parameters may include battery attribute parameter fb, charge-discharge related parameter fp, usage environment parameter fe, and vehicle-related parameter fv (e.g., parameters of an vehicle and electronics therein).

Creating a battery degradation model involves determining a relationship between the battery degradation and respective degradation-related parameters. This relationship may be expressed in a mathematic expression or in the form of a table or database. The initial or updated degradation model of a battery may be expressed with the following equation:

$$\text{Battery degradation model } Ds = \text{Func}(fb, fp, fe, fv) \quad (1).$$

The model Ds takes into account not only the battery attribute parameter fb and the charge-discharge related parameter fp, but also the usage environment parameter fe and the vehicle-related parameter fv.

The above model may reflect the relationship between the battery degradation and the degradation-related parameters at a particular measurement time. Such model based on degradation-related parameters at a particular measurement time may better reflect the degradation condition of a given battery used in a certain device. However, for usages such as battery rental, this model based on instantaneous parameters cannot form a complete degradation model, and thus cannot be used to compute the actual degradation of the battery. The present disclosure may not only collect current degradation-related parameters but also maintain history degradation-related parameters, and thus form a degradation-related parameter log, or DCL, for a given battery. DCL may be expressed with the following equation (2):

$$DCL\_t = DCL\_t-1 + (fb\_t, fp\_t, fe\_t, fv\_t) \quad (2).$$

Accordingly, the degradation model of the present disclosure becomes a function of inherent DCL as given in the following equation (3):

$$\text{Degradation model} = \text{Func}(DCL\_t) \quad (3).$$

Parameters related to a battery can be divided into battery attribute, operation parameter, environment parameter, vehicle parameter, operation mode, user information, and so on. The battery attribute may include attributes such as battery ID (uniquely identifying the battery throughout a network), battery brand, battery model, battery type, battery quality, battery's date of production, battery's producer price, and rated full capacity. The operation parameter may includes the parameters such as how many times the battery is charged, battery data collected periodically, battery data collected upon a conditional trigger, and measured history data and the like. The environment parameter may include the parameters such as environment temperature and humidity. The vehicle parameter may include the data such as vehicle manufacturer ID, model ID, weight, vehicle ID, electronics level parameter (high/median/low level). The operation modes may include the data such as ratios of various road conditions (normal urban area, congested urban area, un-congested urban area, highway, mountainous area, plain). The user information may include the data such as user ID, user's driving style (driving mildly, high frequency of abrupt acceleration, high frequency of abrupt deceleration/high frequency of braking). It should be noted that the above parameters are merely examples, and the present disclosure is not limited to but may include or use other or more parameters.

The operation parameters may also include battery data collected periodically, battery data collected upon a conditional trigger, and measured history data. The battery data collected periodically may include but not limited to, for example, collection time, overall voltage, overall current, battery temperature, pack voltage, pack current, packet inner resistance, and pack SOH (State of Health) and the like. The battery data collected with a trigger may include but not limited to, for example, collection time, pre-charge SOC (State of Charge), post-charge SOC, amount of charged power, charge current, pre-discharge SOC, post-discharge SOC, amount of discharged power, and discharge current.

The measured history data may include but not limited to, for example, a plurality of history degradation values and their corresponding time instances.

The above are examples of the parameters fb, fp, fe and fv that are available for collection. In an example of a typical parameter collection system, the following parameters may be collected:

| Battery attributes | battery ID (uniquely identifying the battery throughout a network), battery brand, battery model, battery type, battery quality, battery's date of production, battery's producer price, and rated full capacity | |
|---|---|---|
| operation parameters | how many times the battery is charged, battery data collected periodically, battery data collected upon a conditional trigger, and measured history data | |
| | battery data collected periodically | collection time, overall voltage, overall current, battery temperature, pack voltage, pack current, packet inner resistance |
| | battery data collected upon a conditional trigger | collection time, amount of charged power, charge current, amount of discharged power, and discharge current |
| | measured history data | a plurality of history degradation values and their corresponding time instances |
| vehicle parameters | vehicle weight, vehicle ID, electronics level parameter (high/median/low level) | |
| User information | user information ID | |

Figure 7:
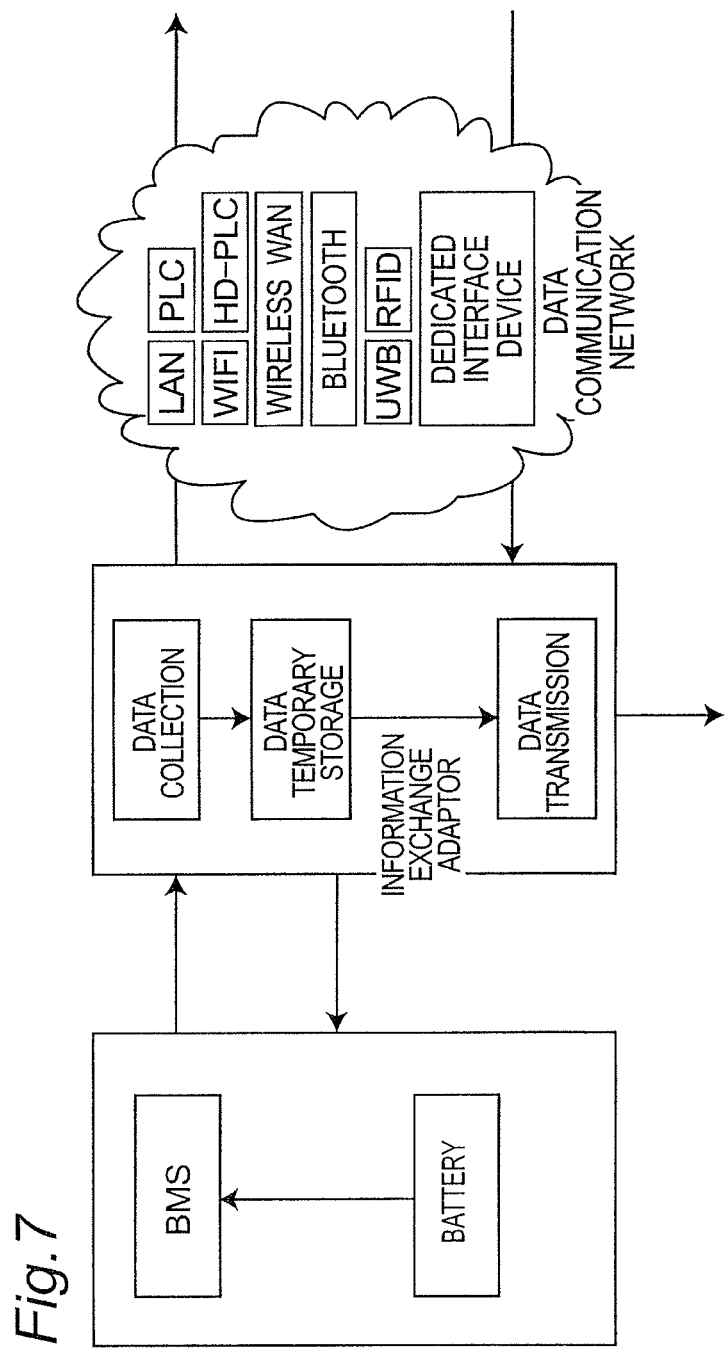
FIG. 7 is a schematic diagram of a parameter collection subsystem and a transmission network which shows factors for battery degradation according to an embodiment of the present disclosure.

FIG. 7 is a schematic diagram of an example of a parameter collection subsystem and a transmission network which shows factors for battery degradation. The battery system shown in the left of FIG. 7 includes a battery management system (BMS) and batteries The batteries may include a plurality of battery packs. The middle of FIG. 7 shows the internal structure of the information exchange adaptor, and the right shows the transmission network. In some cases, the battery system may not include the BMS system.

In FIG. 7, the data collection unit collects data from the battery system at regular interval or upon a trigger. The times of data collection may be performed as desired. Information of the battery itself may be read from the battery system via the data collection unit in a one-time manner. If there are multiple battery packs, the collection and writing process of each pack may be the same as that of pack 1.

If the battery system includes a BMS or BMSs, each of the BMSs may couples to a respective battery pack, or the BMS is for the overall battery system and couples to multiple battery packs. The BMS or BMSs may collect battery data required by the information exchange adaptor via certain type of data bus. Under different system requirements, the BMS may be configured to deter mine, for example, the data to be collected, the collected data to be converted, and the data be not required temporarily and filtered to transmit to the information exchange adaptor.

The information exchange adaptor may include a data collection module, a data temporary storage, and a data transmission module. The data collection module may obtain data from the BMS or battery packs in the battery system via USB, RS232, series port or other dedicated data interfaces, and store the obtained data in the data temporary storage. Other data obtained via a data communication network, such as degradation computation results obtained from the degradation computation subsystem may also be stored in the data temporary storage. The data transmission module may transmit the battery DCL data stored in the temporary storage to the degradation computation subsystem via the data communication network. The analysis results of degradation data stored in the storage may also be transmitted to the data application subsystem via the data transmission module.

Figure 8:
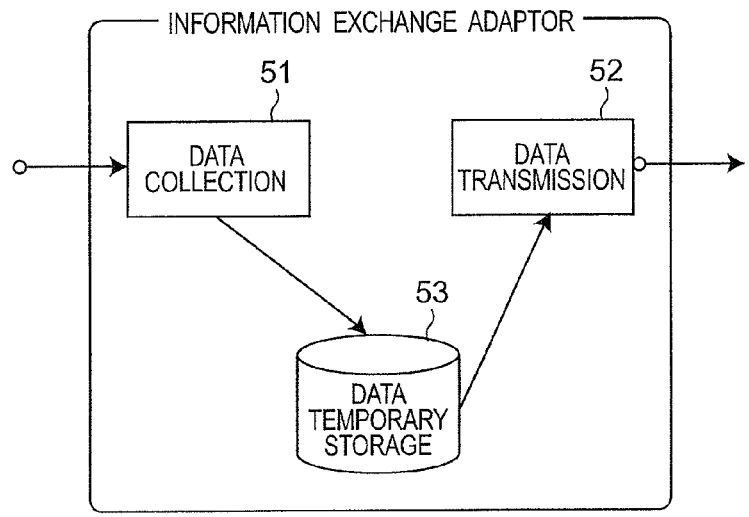
FIG. 8 shows details of an information exchange adaptor module in the subsystem of FIG. 7.

FIG. 8 shows details of an information exchange adaptor module in FIG. 7. The information exchange adaptor shown in FIG. 8 may include a DCL data collection interface 51, a DCL data temporary storage 52, and a DCL data transmission interface 53 (for simplicity, the data transmission module is not shown). In addition to parameters related to the battery system, the DCL data collection interface 51 may receive other data that cannot be obtained from the battery system, such as vehicle ID, vehicle electronics levels from other respective control units via data bus. Further, the DCL data collection interface 51 may read from the degradation computation subsystem, via the network, history data that need to be locally stored, such as history degradation data and corresponding time instances. The data obtained as above are written into the DCL data temporary storage 52. The DCL data transmission interface 53 provides data come from the DCL data temporary storage 52.

The DCL data temporary storage 52 may be divided into two logic data blocks, i.e., a persistent storage area and a temporary storage area. The persistent storage area may store data to be maintained for a long time, including "battery attribute" parameter and "measured history data" among "operation parameters." The "battery attribute" parameter remains the same throughout the life cycle of a battery, and thus no modification is required after the parameter is initially written. "Operation parameters," such as "measured history data," may be accumulated and written into the storage area for many times, and may be used as important history degradation data for later use. Different from the "battery attribute" parameter, the latter data may be partly deleted due to limited storage capacity. This may generally occur while new degradation data are written in. If the storage capacity is insufficient, an old entry of data will be replaced with a new one. A data entry available to be replaced includes:

1. history degradation data entry having the earliest recording time in the area;
2. data entry having the shortest time interval with its two neighbor entries in the area;
3. data entry having the least degradation difference from its two neighbor entries in the area.

If the above three data entries correspond to three rules, one of the three rules may be applied in replacing an old entry. Alternatively, two or all of the three rules may be used together.

Among the DCL data collected in the system, data related to battery discharge may be collected in the format as shown in Table 1.

TABLE 1

| Format of data related to battery discharge | | |
| --- | --- | --- |
| Time | Output Current | Output Voltage |

Data related to battery charge may be collected in the format as shown in Table 2.

TABLE 2

| Format of data related to battery charge | | |
| --- | --- | --- |
| Time | Input Current | Input Voltage |

Data may be transmitted to the DCL module in the format as shown in Table 3.

TABLE 3

| Format of data transmitted to the DCL module | | | | | |
| --- | --- | --- | --- | --- | --- |
| Time | Battery Information | Vehicle Information | Array of Discharge Information | Array of Charge Information | Others |

Collection of battery parameters may be classified to one-time collection, periodical collection, and triggered collection. One-time collection may collect battery attributes, for example. Parameters related to battery attributes generally remain unchanged throughout the life cycle of a battery. Therefore, these parameters may be collected once for all and recorded inside the battery. Periodical collection may collect part of operation parameters, for example. Throughout the life cycle of a battery, the battery will be constantly charged and discharged. Even in an unused state, the battery is discharged slowly. This affects the battery degradation. In order to observe respective states of the battery during its life cycle, it is necessary to collect certain parameters periodically. Collection period may be determined by the BMS, and may be set or reset in another way. Triggered collection may generally collect not only the part of operation parameters as mention above, such as parameters related to battery charge, but also vehicle parameters and user information to be recorded upon circulation of a battery. In addition, degradation-related data and time instances at each time of degradation computation should be recorded.

The following describes how the various parameters for battery degradation are collected.

Many batteries each have a built-in BMS for managing charge and discharge and recording and maintaining basic information of the battery. The BMS inside the battery may be used to collect desired parameters. For an FBP, both the BMS of each single battery pack and a battery bank management system for managing a plurality of battery packs contained in a battery bank may be used to collect parameters. An external information collection device attached to a battery pack may be used to collect parameters that cannot be collected by the BMS. Additional sensor(s) may be installed to acquire further information that cannot be collected by the BMS. Alternatively, the BMS may be modified accordingly. Various types of sensors may be used to collect a variety of parameters.

Vehicle parameters and electronics parameters may be also desired, while they cannot be collected by the BMS or any sensor inside the battery. These parameters may be acquired through a vehicle-related controller (e.g., ECU), and transmitted via a data bus (e.g., LIN/CAN/FlexRay and the like in the vehicle) to the system of the present disclosure for recording. Other parameters, such as user information, are difficult to be collected as described above. The methods and devices for parameter collection in the present disclosure are not limited to the foregoing, but may include other more flexible methods and devices. For example, data may be manually entered into the system through a dedicated terminal. Alternatively, data may be imported from external through dedicated software or downloaded in a wired or wireless manner. These methods may be used for all the parameters.

The collected raw DCL data (e.g., parameters like voltage, current, weight) may not be directly used in creating and updating the degradation model, or computing the degradation. All of the raw DCL data may be transformed into, for example, the above four types of parameters related to battery degradation as follows:

Parameter E=func(fe)
Parameter V=func(fv)
Parameter P=func(fp)
Parameter B=func(fb)

Each time a set of DCL data has been collected, the DCL data may be classified to the four types, and transformed to obtain four abstract parameters representing the set of DCL data. Parameters E, V, P and B form a quadrant parameter set (E, V, P, B), which may contain or be transformed from data such as battery ID, battery brand, battery model, battery type, battery quality, battery's date of production, battery's producer price, rated full capacity, discharge current, discharge voltage, battery internal resistance, environment temperature, but not limited. The quadrant parameter set may be directly used in creating and updating a degradation model.

The collected and transformed parameters related to battery degradation may be temporarily or permanently stored in storage device built in the information exchange adaptor, or a dedicated storage device external to the information exchange adaptor. The external data storage device may couple to the information exchange adaptor via a local universal or a dedicated interface or a communication network. The storage device may store both collected raw data and transformed quadrant parameter set, or may store only the abstracted quadrant parameter set.

2. Parameter Transmission Network for Battery Degradation Factors

Various parameters related to battery degradation and collected by the collection subsystem can be transmitted to a data center of the degradation computation subsystem via a transmission network for use in degradation computation. The parameter transmission network can be implemented in any possible form, such as wired (including twisted-pair, coaxial cable, optical fiber, ADSL, FTTH, power line communication HD-PLC/PLC, etc.) or wireless (including wide area wireless communication such as 2G/3G/4G, GSM, and short range wireless communication such as WiFi, Bluetooth, UWB, RFID), as shown in the middle of FIG. 7.

Parameters may be transmitted in many manners. For example, data of a battery pack (bank) may be transmitted directly to the data center. Parameters stored inside a battery may be transmitted wirelessly via a communication device external to the battery.

Parameters collected from or stored inside the battery may be transmitted to the data center via a battery charge/replace device. In this case, when a battery is charged or replaced at a charge/replace station, parameters stored in the battery may be read a dedicated matching interface between the charge/replace device and the battery, and transmitted over a communication line between the charge/replace device and the data center. In some situations, the charge/replace device may transmit data to the battery. For example, after obtaining relevant information of a battery, the charge/replace station may compute (or acquire, via the data center) the degradation of the battery, such as degradation proportion, residual value and the like, and transmit to the battery the computed degradation information and corresponding time instance in one or more of the above three transmission methods, i.e., dedicated device and interface, wired network and wireless network.

Information about the battery charging may also be transmitted to the battery in one of the above transmission methods. The battery may exchange data directly with the data center. For example, the charge/replace station itself may act as a power center, or each of the charge/replace stations in a network may act as data center (Cloud Computing).

There are cases where a charge/replace station may be able to store few data or no data due to certain limitation. In these cases, the charge/replace station may transmit the battery DCL data to the data center once it obtains the data. The data may be transmitted over the wired or wireless network as mentioned above.

A special case is that all of the charge/replace station in a network may have the function of data center, i.e., the case of Cloud Computing. Data may be exchanged between data centers freely or as desired, and data may also be transmitted over the wired or wireless network.

3. Creation and Update Subsystem for Battery Degradation Model

Battery degradation may result from various factors, such as battery characteristics, use condition and environment condition, and may have a complex non-linear relationship with parameters representing these factors. A feasible method for determining degradation of a battery may involve statistically or experimentally establishing a relationship between the degradation and respective collected parameters, and determining the degradation based on the relationship. However, a degradation model established with finite experimental data may accurately reflect the degradation of a battery with respect to only a small part of the parameters. For the other large part of the parameters, degradation estimated from such model is often deviated from its actual value.

The degradation model of a battery according to the present disclosure may serve as basis for computing degradation of the battery. The degradation model utilizes both recent information of battery degradation and history information in the history log. The degradation model according to the present disclosure is a function of the DCL parameters in the history log of battery degradation. The degradation model may be maintained inside a battery, a battery pack, a charge/replace station or a data center.

The degradation model of a battery according to the present disclosure may be created in the following manner.

First, an initial degradation model may be created.

The initial degradation model may be created with experiments or other methods, and may act as a database containing correspondence between degradation and respective related parameters. Based on the collected values of respective related parameters, the database may be looked up to find the closest degradation value. Degradation-related parameters of an EV battery may include battery parameters, vehicle types, in-vehicle electronics parameters, traveled road condition parameters, environment parameters, etc. As mentioned above, these parameters may be transformed into a quadrant parameter set (E, V, P, B). Accordingly, the initial degradation model may be considered as a table formed of degradation D and quadrant parameter set (E, V, P, B). The number of each parameter in the quadrant parameter set may be determined according to the range of values available to the parameter and quantification precision. Suppose that the numbers of parameters (E, V, P, B) may be m, n, k, t, respectively, the number of rows in the table would be a product of m, n, k, t. Each row of the table may contain values of parameters (E, V, P, B) arranged in an ascending or descending order. Table 4 shows an example of initial degradation model created with m, n, k, t being 1, 2, 2, 2, respectively. The initial degradation model may be created with cycles of rapid charge and discharge, and/or other test data.

TABLE 4

Example of Initial Degradation Model

| Degradation D | Parameter E | Parameter V | Parameter P | Parameter B |
|---|---|---|---|---|
| d1 | e1 | v1 | p1 | b1 |
| d2 | e1 | v1 | p1 | b2 |
| d3 | e1 | v1 | p2 | b1 |
| d4 | e1 | v1 | p2 | b2 |
| d5 | e1 | v2 | p1 | b1 |
| d6 | e1 | V2 | p1 | b2 |
| d7 | e1 | V2 | p2 | b1 |
| d8 | e1 | V2 | p2 | b2 |

There are many factors affecting the degradation of a battery, and interaction among these factors may result in error or deviation of degradation value based on the initial degradation model from the actual value. The error may be further enlarged particularly in the case of battery rental. To gradually reduce or remove the error, the initial degradation model may be extended to generate new values of degradation corresponding to different combinations of degradation-related parameters, in accordance with the present disclosure. That is, the degradation model of the present disclosure may be created by generating new degradation values to extend the initial degradation model. The simplest way to extend the model is using the method of linear data interpolation. The present disclosure is not limited to this, but may use any other method, such as non-linear interpolation, to generate new degradation values. The generation of the new data may be performed in a fixed manner, or may change with conditions. As data collected and transmitted by the collection subsystem increases in volume, the database may be enlarged accordingly. To prevent the database from becoming excessively huge, quantification precision may be set for each parameter to determine to which extent or scale the database may be enlarged. The degradation model may be created with one type of battery from a manufacturer or a given battery being subject of the model. In the latter case, measurement error caused by difference between individual batteries may be eliminated. Table 5 below gives new items of degradation values obtained through linear data interpolation.

TABLE 5

Interpolation of New Items

| Degradation D | Parameter E | Parameter V | Parameter P | Parameter B |
|---|---|---|---|---|
| Dx | e1 | v1 | p1 | b1 |
| ... | ... | ... | ... | ... |
| Dz | e1_m_2 | v1_i_2 | p1_j_2 | b1_k_2 |
| ... | ... | ... | ... | ... |
| Dy | e2 | v2 | p2 | b2 |

Second, the degradation model may be updated.

After creating an initial degradation model, the model can be updated with the collected and transformed parameters. New quadrant parameter set may be:

(e1_m_2, v1_i_2, b1_k_2)

In the present disclosure, for simplicity, if a parameter V is between V1 and V2, the parameter V may be expressed as v1_i_2, wherein i represents a position at which the parameter is located between V1 and V2 (e.g., v1_25_2 represents that the parameter V is located in a position between V1 and V2 and larger than V1 by 25%). This also applies to parameters in other columns. In a table configured as above, two existing row of data items related to a new row of data items may be determined before generating the new row. The determination may satisfy a condition that each of data items in each existing row must be equal or adjacent to the corresponding data item in the new row. The two related rows of data items may be found in the initial degradation model, such as (e1, v1, p1, b1) and (e2, v2, p2, b2) which are related to the new row as shown in FIG. 5. The values of dx, dy may be obtained from the initial model based on the values of parameters such as in the Table 4. Further, there exist several rows of data items between dx, dz and dy. In this case, dz may be computed with the following model updating formula:

$$D_z = (D_x * m + D_y * (1-m)) * \frac{W(e)}{W(e) + W(b) + W(v) + W(p)} +$$
$$(D_x * i + D_y * (1-i)) * \frac{W(v)}{W(e) + W(b) + W(v) + W(p)} +$$
$$(D_x * j + D_y * (1-j)) * \frac{W(p)}{W(e) + W(b) + W(v) + W(p)} +$$
$$(D_x * k + D_y * (1-k)) * \frac{W(b)}{W(e) + W(b) + W(v) + W(p)}$$

where W(e), W(b), W(v), W(p) represents weights of four columns of parameters in computing the degradation, respectively, and may reflect to which extent the four types of parameters affect the degradation. Degradation dz corresponding to the above new parameter set may be obtained with the above formula. Then, the computed new data items may be inserted into the table according to the above-mentioned rule.

There may be cases where column E and column B each have a limited number of values (i.e., the values in columns E and B may be discrete data), while for column V and column P, actual values may be located between the discrete values in the initial model, that is, the values in columns V and P may be continuous data.

Below generation of new data item in the table will be described in detail.

On one hand, an approximate result may be provided when looking up the table for a particular data item. That is, during looking up the table for degradation value corresponding to a particular parameter set, if a parameter set existent in the table is similar to the particular parameter set to certain extent, the degradation corresponding to the existing parameter set may be directly used as the looked-for the degradation value per time unit. Otherwise, the initial data item may be used in computing degradation value.

On the other hand, all data items in the table may be sorted with respect to the four parameter columns (E/V/P/B). For example, sorting in Table 4 may start with column E such that data items having the same value in column E are arranged as adjacent items. Then, the items having the same value in column E are sorted with respect to column V. Next, the sorting may be performed with respect to column P/B, and so on. Each of the obtained new items related to degradation may be inserted into an appropriate row of the table according to the above sorting rule, and may function in the same manner as the initial item for further computation. Tables 6 and 7 below illustrate how a table is changed after insertion of new data items among the initial data items.

TABLE 6

Initial Data Item

| Dx | E1 | B2 | P1 | V2 |
|---|---|---|---|---|
| ... | ... | ... | ... | ... |
| Dy | E1 | B2 | P2 | V3 |

Suppose that a new data item to be inserted is E1/B2/P1_23_2/V2_43_3. The two rows of data items are related to the new item. Table 7 shows part of the table after being inserted with the new item.

TABLE 7

Degradation Model Table with Inserted Updated Data Item

| Dx | E1 | B2 | P1 | V2 |
|---|---|---|---|---|
| ... | ... | ... | ... | ... |
| Dz | E1 | B2 | P1.23 | V2.43 |
| ... | ... | ... | ... | ... |
| Dy | E1 | B2 | P2 | V3 |

As can be seen from the above tables, new items may be inserted in according to the foregoing sorting rule, and may be used as reference data for further computation.

Further, in current conditions of lithium battery production, individual batteries, even manufactured in the same factory, belonging to the same type or manufactured in the same batch, may have significant difference from each other. Accordingly, column B representing battery type may be further processed. For example, a particular battery's ID may be collected and transmitted at the data collection stage, and may be written into a degradation table at the time of recording data in the table. In other words, the degradation table may substantially contain one separate table for each individual battery, and these separate tables may be stored independently. Alternatively, data for all individual batteries may be stored in a large table as described above. In this case, as described above, new data items may also be inserted into the table after initializing it to update the model. As amount of data grows, and when there are sufficient data for a subject individual battery in the table, the degradation parameters in the table may be reduced to three parameters (E/P/V), and may be processed in the same manner as described above.

The foregoing describes insertion of new data items and selection of related data items. Now computing Dz in Table 7 will be described. It is known that Dz corresponds to four parameters E1/B2/P1j2/V2k3, where j and k (expressed as percentage) represents differences between parameters P, V in current row and corresponding parameters in an adjacent row, respectively. The degradation data of the two related rows as obtained above may be used to compute new column D, i.e., the degradation per time unit corresponding to the above four parameters. Suppose that V1-V2, P2-P3 have approximately linear influence on column D, then two weights W(v) and W(p) may be determined for column V and column P, respectively. The value of column D may be computed with the following formula (4):

$$D = (D_x * j + D_y * (1-j)) * \frac{W(v)}{W(v) + W(p)} + \quad (4)$$
$$(D_x * k + D_y * (1-k)) * \frac{W(p)}{W(v) + W(p)}.$$

In this way, the degradation per time unit may be computed with the initial data items in the table and the measured characteristic parameters. The degradation model may be thus updated with newly inserted data items.

Calibration and updating of the degradation model will be described below. During the process of updating the degradation model with the DCL data and the above algorithm, error may occur when estimating the value of degradation, as newly added data items are actually computed with a mathematic algorithm. The error may be accumulated and transferred, leading to larger error in the degradation model. In view of the problem, the present disclosure provides a method for calibrating and updating the degradation model. According to the present disclosure, certain batteries may be selected as calibration samples in a certain manner. Under a particular condition, these samples are subjected to fast charge/discharge experiments or other appropriate methods to obtain an accurate value of the degradation for this type of battery. The accurate degradation value and corresponding history degradation log of the battery may be inputted to the degradation model, and thus used to calibrate and update the degradation values existent in the table as well as the degradation values derived from the table. In this way, the degradation model may have its accuracy gradually improved through the process of repeated creation and updating. Table 8 gives newly inserted data items.

TABLE 8

| dz | e1_m_2 | v1_i_2 | p1_j_2 | b1_k_2 |
| --- | --- | --- | --- | --- |

In Table 8, the data item in column D may be computed from data items of other columns D, and may have error with respect to its actual value. At the time of calibration, the battery selected as sample may be subjected to fast cycle of charge and discharge in a test condition matched with that for e1_m_2, v1_i_2, p1_j_2 and b1_k_2, to obtain the actual value d of the degradation. Then, the value d may be used to correct the value dz in the table in different manners. One method is replacing the value dz directly with the value d. Another method is taking a value between dz and d. After being calibrated, the row may be used as reference for calibrating other rows. The calibration may utilize the above model updating formula to conduct repeated computation.

4. Battery Degradation Computation Subsystem

Below the computation subsystem will be described. Battery degradation computation is often performed during circulation of a battery, so that fee involved in battery exchange can be accurately determined. At this moment, the degradation model for a battery is first updated with the battery's DCL data. Then the degradation value is computed for the battery. The DCL data and the computed degradation value may be transmitted to the DCL database, and transmitted back to the information exchange adaptor via the data analysis system. Transmitting the degradation-related data back to the information exchange adaptor may be advantageous since the database of the data center may be not available for access at the time of computing the degradation value, for example. In this case, the degradation-related data transmitted back to the information exchange adaptor may be utilized. In addition, the data application subsystem may acquire desired information from the information exchange adaptor.

If a battery charge/exchange station cannot establish communication connection to the data center, the station may first update the degradation model and compute the degradation value. Then, the station may transmit degradation-related data to the battery, and store locally all data to be transmitted to the data center so that the data may be transmitted to the data center later when the communication connection to the data center is established. If the charge/exchange station is incapable of computing and storing the data, the station may communicate with the information exchange adaptor via a specific device to acquire data stored in the latter for degradation computation. The specific device here is a device that may be temporarily used in case that the charge/exchange station is unable to provide normal service (e.g., when computation or storage unit of the station is unavailable), and may be a handheld or stationary device. This specific device may couple to the information exchange adaptor by means of a compatible interface to acquire the data, and may perform basic degradation computation based on the acquired DCL data and the history degradation values. In this case, it may be necessary for the device to store at least data for initial degradation model in order to provide basic degradation computation.

In the above case, the DCL data and the degradation values may be stored in the specific device. The data may be transmitted up to the charge/exchange station and further transmitted to the data center, if the charge/exchange station is configured to do so. Further, the DCL data and degradation values may be stored in the storage system of the battery. These data may be transmitted up to the charge/exchange station via a wired or wireless network, or may be communicated directly with a specific interface, if the charge/exchange station is configured to do so.

Degradation computation may be conveniently performed using the degradation model based on a database. The following Table 9 shows accumulated degradation data, and may be obtained by processing DCL data collected by the collection module.

TABLE 9

| Accumulated Degradation Data Table | | | | |
| --- | --- | --- | --- | --- |
| T1(time) | E1 | B1 | P1 | V1 |
| T2(time) | E2 | B2 | P2 | V2 |
| ... | ... | ... | ... | ... |
| Tn(time) | En | Bn | Pn | Vn |

Table 9 shows respective types of degradation parameter sets, and corresponding durations. With the following formula (5), it is possible to simply compute to the increase in degradation since the previous degradation measurement.

$$T1*D1 + T2*D2 + \ldots + Tn*Dn \quad (5)$$

Current degradation of the battery may be obtained by adding the value computed with the formula (5) to the previously stored degradation value.

Figure 15:
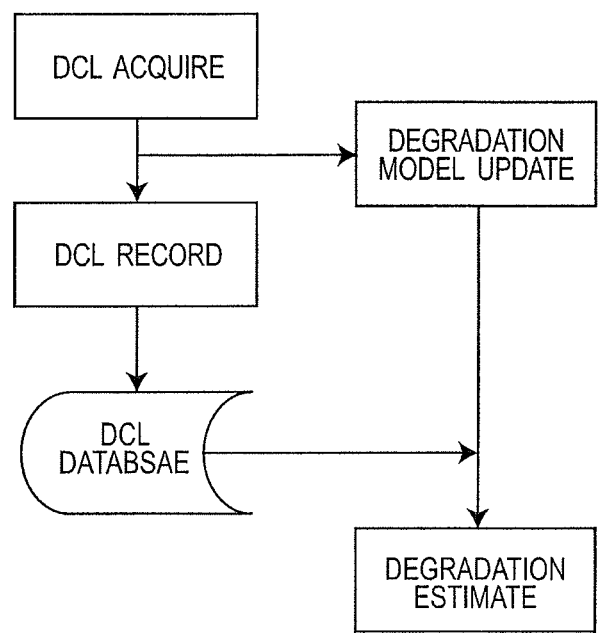
FIG. 15 shows an operation flow of a degradation computation module according to an embodiment of the present disclosure.

FIG. 15 shows a flow operated by the degradation computation module according to the present disclosure. As shown in FIG. 15, the flow may first acquire the DCL data, and then record and store the DCL data in a DCL database. Then, the flow may update a degradation model for a battery with the acquired DCL data. After that, the flow may estimate or compute the battery's degradation based on the stored DCL data in the DCL database and the updated degradation model.

5. Data Application Subsystem Based on Battery Degradation

In existing battery management and application systems based on battery degradation, utilization of information about battery degradation is generally confined to determining whether a battery can be further used or providing a coarse estimation of residual level due to low accuracy of battery degradation measurement. The system for obtaining battery degradation according to the present disclosure maintains history degradation information, i.e., DCL, and thus can obtain degradation information with higher accuracy. The present disclosure also provides a method for improving battery utilization.

Figure 9:
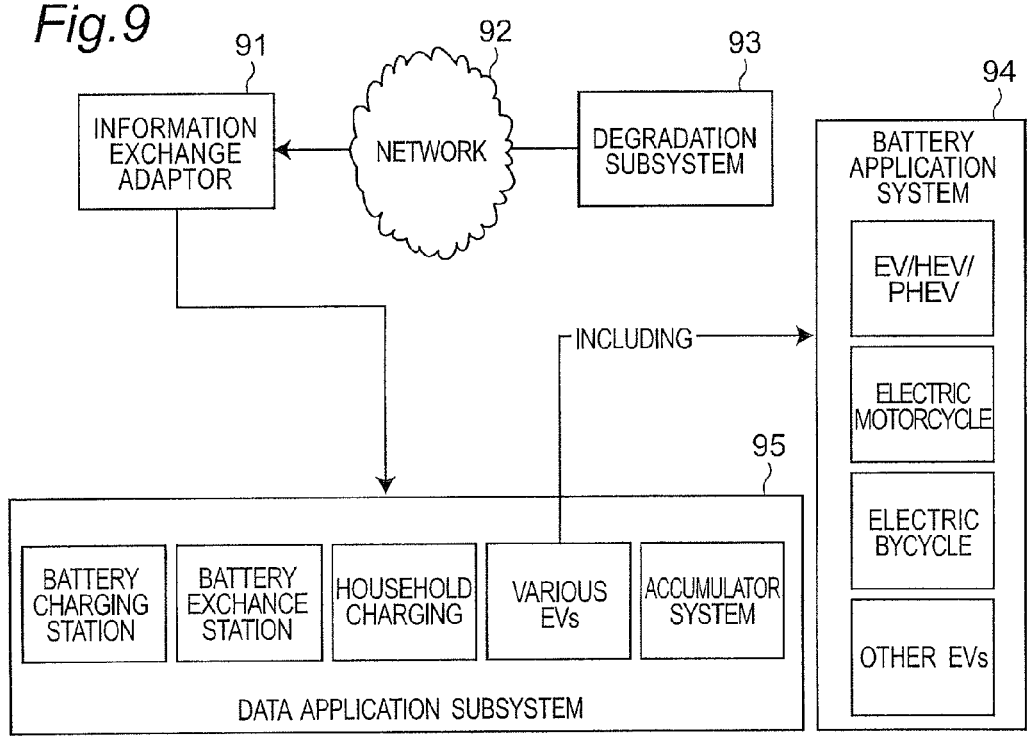
FIG. 9 shows a data application subsystem of a system for measuring degradation of a battery according to an embodiment of the present disclosure.

FIG. 9 is a schematic diagram showing a data application subsystem of a system for measuring or obtaining degradation of a battery according to the present disclosure. The information exchange adaptor 91 is coupled to the battery degradation subsystem 93 via the transmission network 92, as shown in FIG. 9.

The application subsystem 94 of FIG. 9 may be applied to EVs like electric automobile, hybrid power automobile, electric motorcycle and electric bicycle, and also to various circumstances of using battery degradation measurements, for example, a battery charge station, a battery exchange station, and a household charge system. In these circumstances, the collected DCL data and computed degradation values may be used to create many new applications. For example, the battery degradation-related data may be used to accurately compute a battery's residual value, which may be simply computed with the formula (6) as follows.

$$\text{Battery's Residual Value} = \text{Battery's Producer Price} * \text{Battery Degradation} \quad (6)$$

A corresponding price based on the battery's residual value may be determined at the time of rental, assignment or recycle. For example, when renting a battery, a user may be required to pay fee, such as deposit. The amount of the deposit depends on the residual value of the battery to be rented. At the time of battery exchange, the user may need to pay for difference between prices of two batteries to be exchanged. The payment may be expressed in the formula (7).

$$\text{Fee to be paid} = (\text{residual value of a battery exchanged in} - \text{residual value of a battery exchanged out}) + (\text{residual power level of a battery exchanged in} * \text{electricity price} - \text{residual power level of a battery exchanged out} * \text{electricity price}) \quad (7)$$

The residual values of the batteries exchanged in and out are computed on the basis of battery degradation. Further, the residual value of a battery may be computed when the battery is recycled.

With the methods and systems for obtaining battery degradation according to the present disclosure, it is possible to compute and collect DCL data and degradation of a battery, and thus provide useful information to the user. The relationship between one or some of the parameters in the DCL and the degradation, based on the DCL data and respective degradation values stored in the database. It is possible to perform control or manipulation to slow down the degradation process of the battery.

For example, the computed data may be transmitted in a certain data format to a data receiving system of an electric automobile or hybrid power automobile via a wired or wireless network. A battery control system built in a vehicle may control (including control over battery charging and discharging and connection schemes) respective batteries according to the batteries' degradation values so that the batteries may be in their optimal operation states.

The methods and systems for obtaining battery degradation according to the present disclosure may obtain (through collecting and computing) a large amount of data related to factors influencing the battery degradation. For example, it is possible to obtain a relationship between degradation and battery type in different environment (e.g., temperature, humidity). It is thus possible to achieve in-depth analysis and understanding of mechanisms of battery degradation base on these data.

The methods and systems for obtaining battery degradation according to the present disclosure may provide reference information and relevant control during battery charging process (at a charge station or at home). For example, according to requirements in different charging modes, such as the shortest charging time, the smallest power consumption, the least degradation damage to the battery, etc., it is possible to adaptively configure optimal parameters during battery charging, such as charging voltage, charging current, dynamic modes of charging, charging stop condition, and so on. It is also possible to compute and analyze influence of various charging conditions on the battery degradation, so that the charging station may select the optimal condition. It is also possible to compute and analyze influence on the battery degradation from different State of Charge (SOC, also called saturation of charge) after the battery has been charged, so that the charging station may select an optimal charging scheme. It is possible to compute and analyze influence on the battery degradation from length of charging duration, so that the charging station may select an optimal charging scheme.

The system for obtaining battery degradation according to the present disclosure may obtain during its operation various data including battery's DCL data, degradation-related parameters, degradation data and comparison of degradation in unit time. Further data applications may be provided in various forms based on these data. The applications may include, but not limited to, the following particular scenarios as shown in the left of FIG. 9.

1) Battery charging. Relationship between charging current, duration and depth and battery degradation rate may be obtained based on the analysis of history DCL data. After selection of the optimal charging scheme, the data may be provided to the charging control system of the battery charging station, which may charge the battery according to the optimal (or suboptimal) charging scheme, if it is possible. This may slow down the degradation of the battery as much as possible. In cases of requiring a fast charging of the battery, the history DCL data may be analyzed to find which charging scheme is better for fast charging. For example, charging depth's influence on battery degradation may be derived with respect to a fast charging operation, and the result may be transferred to the control system of the charging station.

2) Battery exchange. In a typical system, battery degradation data obtained by the system may be used to compute the battery's residual value.

When renting a battery, a user may be required to pay fee, such as deposit. The amount of the deposit depends on the residual value of the battery to be rented.

At the time of battery exchange, the user may need to pay for difference between prices of two batteries to be exchanged, as expressed in the above formula (7).

The residual values of the batteries exchanged in and out are computed on the basis of battery degradation. The above formula (6) shows how to compute the residual value of a battery.

Further, the residual value of a battery may be computed when the battery is recycled.

3) Vehicle control. As shown in FIG. 9, the analysis result of the DCL data may be transmitted to a user who is using the battery, such as a user of electric automobile, in a wired or wireless way or using a dedicated device. From these data, it is possible to easily obtain influence of various driving patterns on the battery degradation, such as influences of speed, acceleration, or deceleration, so that the user may have the automobile operated with the battery being in its optimal state, thereby considerably reduce the battery degradation rate.

It is also possible to obtain a person's driving style, such as normal driving speed, or magnitude of acceleration or deceleration. Meanwhile, the DCL data may be analyzed to determine which type of battery (e.g., battery produced by which manufacturer) may attain its optimal performance or lowest damage in the person's driving style. These data are very useful for a battery exchange station.

Figure 10:
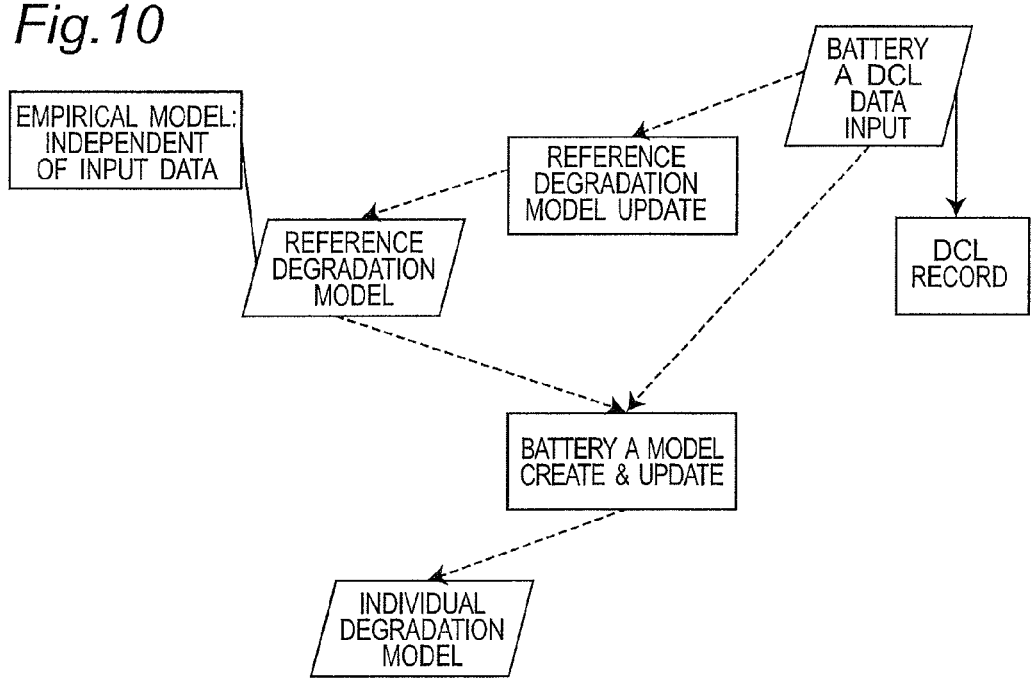
FIG. 10 is a schematic diagram showing a process of creating and updating a battery degradation model according to an embodiment of the present disclosure.

FIG. 10 is a schematic diagram showing an embodiment of a process of creating and updating a battery degradation model according to an example of the present disclosure. In a typical embodiment, the user of battery A may transmit the DCL of battery A to a BSC (battery application management center). The BSC may first record the DCL data of battery A in a database, and update an initial degradation model with the DCL data. The BSC may look up the database for a specific degradation model corresponding to battery A. If the specific degradation model exists, the BSC may update the model with the recorded DCL data of battery A. If no such model exists, a specific degradation model may be created on the basis of the updated initial model and currently recorded data.

The degradation parameter log data may be transmitted to the battery application management center during the process of creating and updating a battery degradation model. The battery application management center may record the degradation parameter log data in a database, and update a battery degradation model with the log data. The database may be looked up for corresponding degradation model data items. If there is no corresponding data items in the database, the battery degradation model may be updated based on degradation-related parameters and newly computed degradation values, to generate corresponding data items.

When the degradation-related parameters of degradation model differs from the collected and processed degradation-related parameters by a predetermined value, new data items may be generated for an extended degradation model. The predetermined value may be set according to the required accuracy of degradation model.

Figure 11:
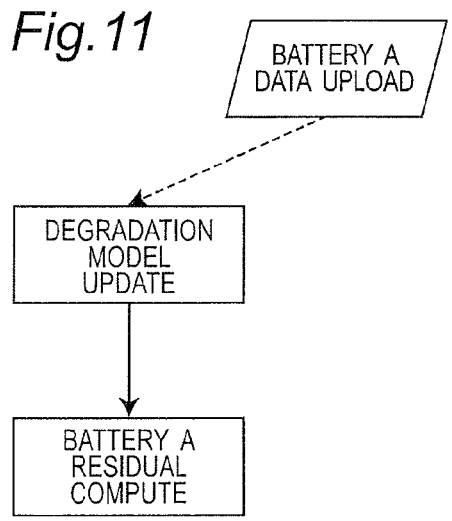
FIG. 11 is a schematic diagram showing a process of computing a battery residual with a battery degradation model according to an embodiment of the present disclosure.
Figure 12:
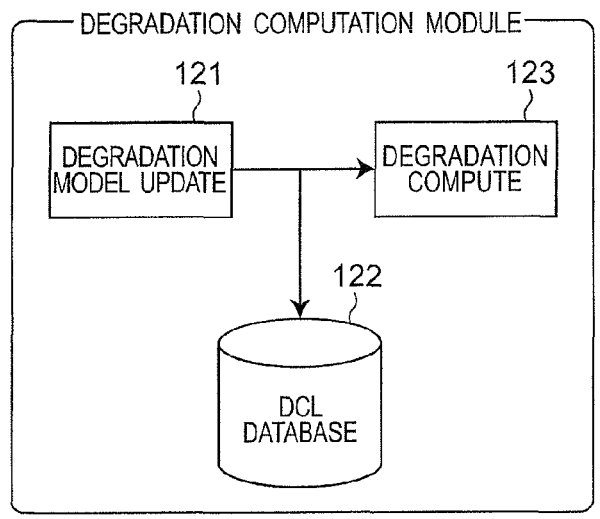
FIG. 12 is a schematic diagram showing a battery residual estimation module according to an embodiment of the present disclosure.

FIG. 11 is a schematic diagram showing a process of computing a battery residual with a battery degradation model according to an embodiment of the present disclosure. FIG. 12 is a schematic diagram showing a battery residual estimation module according to an embodiment of the present disclosure. As shown in FIG. 11, the DCL data of battery A may be first uploaded to the data center or the battery exchange station in the process of battery residual level computation. The data center or the battery exchange station may update the degradation model of battery A with the received DCL data. Then, the residual level of battery A may be computed with the updated degradation model and the DCL data.

The battery residual estimation module of FIG. 12 may include a degradation model update module 121, a DCL database 122 and a degradation computation module 123. The battery residual estimation module of FIG. 12 may perform the residual level computation as shown in FIG. 11. At first, the degradation model update module 121 may update the degradation model of battery A with the uploaded DCL data, and record the DCL data in the DCL database 122. Then, the degradation computation module 123 may compute the residual level of battery A using the update degradation model and the DCL data.

Hereafter, an embodiment of an operation system based on the system for obtaining battery degradation will be described. The BSC maintains the battery DCL data, process and use the information. A user may have right to battery rental, exchange, extension or reduction after paying certain tax. During the process of battery rental, exchange, extension or reduction, fee to be paid by the user may depend on battery residual value computed by the BSC using the degradation model and degradation-related parameters. At an initial rental of a battery, the BSC may record the battery's residual value. Upon battery exchange, the BSC may compute residual values and residual power amounts of two batteries to be exchanged, and compute fee to be paid by the user according to certain fee rate.

Computation of residual value may be not accurate in some situations, for example, when the amount of data in the database is insufficient, or the amount of data corresponding to the battery in the database is insufficient. In these situations, certain compensation may be made. As an example, an empirical model may be introduced, which may represent to which extent a battery degrades with change in a parameter (e.g., elapse of a time period) under an average condition. Then, a degradation difference between the current computed degradation and the previous computed degradation can be obtained. The average degradation extent may be compared with the degradation difference, and a weighted average value may be used for fee computation. The foregoing compensation method may lose its effectiveness as the total data amount and the amount of data corresponding to the battery increase, and may eventually be omitted. In other words, the foregoing method may provide compensation at the initial stage of data processing. Another compensation method may be based on the fact that, each time a battery has been exchanged, its DCL record and degradation record in the database may be increased accordingly, and the degradation computation for the battery may be made with an increased accuracy. The BSC may inversely derive the battery's degradation value at a past moment based on a large amount of currently available accurate data, and compare the derived value with the history degradation value at that past moment. The comparison result may serve as basis for compensating the history value. In this case, the user may conveniently query and find records of compensation during his or her use of a battery, and may select to maintain the records or clear up the records and acquire compensation values with other means or methods.

In an embodiment, the BSC may be a distributed system in which each site may possess different data and the same computation capability. It may generally be assumed that all sites are coupled to the Internet. In degradation computation, the larger the amount of data is, the more accurate the computation result is. However, in the case that one of the sites cannot connect to the Internet or cannot obtain data from the other sites, the site cannot generate relatively accurate data due to insufficiency of its local data. At this moment, the compensation methods described above may be utilized.

Another embodiment is provided with respect to an extreme situation, in which due to some reason, the BSC site accessed by a user cannot access the battery degradation database, cannot utilize the degradation computation module for degradation computation, or cannot obtain even an insufficient accurate degradation computation result, and thus cannot enable activities like battery exchange. This situation is acceptable to the user. To avoid this situation, it is necessary to reserve a storage area in the batter BMS for storing the previous degradation computation result, the initial model, the updated module, and the DCL data (including collected battery data, data related to battery degradation, and parameters related to battery degradation) uploaded in the previous several time instances. The amount of data to be stored may depend on capacity of the storage area. If the above situation appears, it is possible to compute inside the battery a coarse degradation result based on the history DCL data, the initial model and the update model, as basis for battery exchange. The BSC may record the result, and import the record of the site to the database when the system may resume normal operation. Since the computation result is coarse and not accurate enough, it is necessary to make compensation as above described.

In accordance with relevant national standards, a battery shall not be further used once its full charge ratio has been decreased to 80%. At each time of battery exchange, the BSC may recycle any battery having its full charge ratio equal to or lower than 80%, and process the battery to store energy in some other form like accumulator battery or battery for small-sized electric vehicles (e.g., electric motorcycle, electric bicycle). It is also necessary to check states of such battery for energy storage, and the battery should be discarded as useless when the degradation of the battery reaches a certain level. Otherwise, the battery may affect the life cycle of other batteries for energy storage. Therefore, the method for obtaining battery degradation also applies to state checking of a battery for energy storage.

Figure 13:
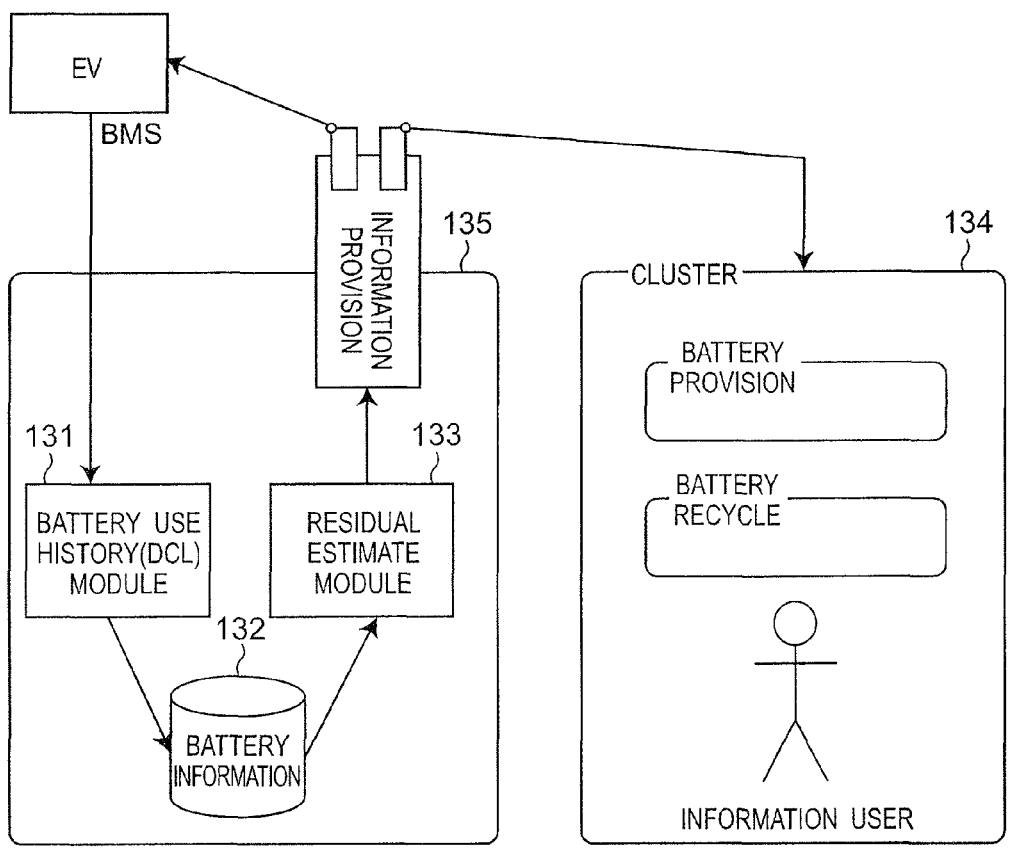
FIG. 13 is a schematic block diagram of an operation system which operates the system for obtaining degradation of a battery according to an embodiment of the present disclosure.

FIG. 13 is a schematic block diagram of an operation system which operates based on the system for obtaining degradation of a battery according to an embodiment of the present disclosure. In FIG. 13, the DCL module 131 may collect parameters related to a battery's degradation from a location where the battery is used (e.g., an automobile), and store the collected parameters in the battery information database 132. The battery residual estimation module 133 may compute the battery's residual level based on the degradation model and the collected parameters, and provide the residual level to the information provision module 135. The information provision module 135 may provide the information about the battery to the BMS of the electric automobile, so that the BMS may control and adjust driving and/or other manipulation of the automobile according to the DCL information. The battery information user 134 may also use the information provided by the information provision module 135 to determine how to operate the battery provision or battery reuse.

In another embodiment, the DCL information may be used. With a large amount of DCL information, and based on the degradation index obtained from the information, initial and updated degradation models, it is possible to easily obtain a relationship between the battery's degradation rate and various critical parameters including battery manufacturer, battery type, driving style, road condition, charge duration at each time, and average charging current at each time. Such data may be useful in business operation.

In a further embodiment, the DCL data includes fixed information collected one time, such as battery ID, battery's data of production, as well as data to be collected and recorded many times, either regularly or upon a trigger. The data collected regularly may include collection time, overall voltage, overall current, battery temperature, pack voltage, pack current, pack internal resistance and pack SOH. The data collected upon a trigger may include one or more pre-charge SOH, post-charge SOH, charged power amount, charging current, pre-discharge SOH, post-discharge SOH, discharging power amount, discharging current.

Figure 14:
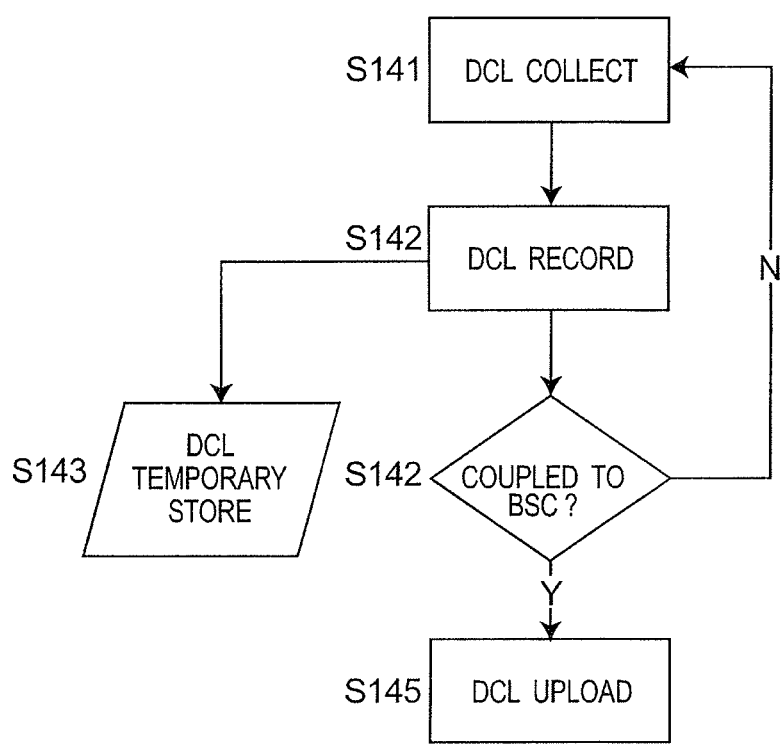
FIG. 14 is a schematic diagram showing an operation flow of a DCL module according to an embodiment of the present disclosure.

FIG. 14 shows the operation flow of the DCL collection module. The DCL collection unit may collect parameters related to battery degradation at step S141, record the collected parameters at step S142, and temporarily store the collected parameter in a temporary storage of the parameter collection subsystem at step S143. Then, at step S144, the BSC may determine whether it is coupled to the data center. If the BSC is coupled to the data center, the BSC may upload the collected DCL data at step S145. If the BSC determines that it is not coupled to the data center, the flow may turn to step S141 for continuously collecting the DCL data.

Among the above data, data collected regularly represent battery parameters which are periodically collected throughout the life cycle of a battery according to a preset period. Such parameters may mainly used to estimate a relationship between the battery degradation level and the lapse of time.

Data collected upon a trigger represent battery parameters which are collected upon a trigger caused by occurrence of certain event (e.g., charging event), without any presetting. Such parameters may mainly used to estimate influence of the certain event (e.g., charging or discharging event, feedback braking event) on the battery degradation.

As described above, the present disclosure relates to methods and systems for obtaining degradation of a battery in an accurate way. The methods and systems use degradation-based parameters to update a degradation model and use the updated model in estimation, thereby obtaining a highly accurate estimate of the degradation.

The present disclosure also relates to various methods for implementing rental, exchange, circulation, reuse and the like of a battery based on the obtained information about degradation of the battery.

According to an aspect of the present disclosure, a method for obtaining degradation of a battery is provided comprising the steps of collecting data of the battery and data related to the degradation of the battery; processing the collected data to obtain parameters related to the degradation of the battery; creating and updating a degradation model for the battery with the obtained parameters; and computing the degradation of the battery by using the degradation model and the obtained parameters related to the degradation.

According a further aspect of the present disclosure, a system for obtaining degradation of a battery is provided comprising: data collection unit configured to collect data of the battery and data related to the degradation of the battery, process the collected data to obtain parameters related to the degradation of the battery, and store the obtained parameters successively in a degradation parameter log; model creation and update unit configured to create and update a degradation model for the battery with the obtained parameters; and degradation computation unit configured to compute the degradation of the battery by using the degradation model and the obtained parameters related to the degradation.

According to a still further aspect of the present disclosure, a method for creating and updating a degradation model of a battery is provided comprising the steps of transmitting data of a degradation parameter log of the battery to a battery application management center; recording, by the battery application management center, the data into a database; using the data to update a degradation model of the battery; looking up the database for data items of the degradation model corresponding to the battery; if the data items do not exist, updating the degradation model with parameters related to the degradation of the battery and a newly computed value of the degradation to generate data items corresponding to the battery.

The present disclosure further provides a data application subsystem using information about a degradation of a battery. The data application subsystem may includes stations where a battery is used, such as a battery charging station, a battery exchange station, a household charging station, various electronic vehicles, power accumulation systems and the like. The data application subsystem may facilitate various aspects, such as battery exchange, charging, management, vehicle traveling, by providing and utilizing battery degradation data, battery-related data, degradation-related parameters, and relationship between them.

According to the present disclosure, there may be some error because certain mathematical derivation model may be used in model updating on the basis of initial degradation. Accordingly, the present disclosure also provides methods for calibrating a degradation model.

Although the present disclosure is described in the above with the parameter collection subsystem for battery degradation factors, the creation and update subsystem for battery degradation model, the computation subsystem for battery degradation, the DCL storage subsystems for degradation-related parameters, the present disclosure may also be implemented with devices or apparatuses having the same function, without any substantial modification.

The foregoing describes the present disclosure with reference to exemplary embodiments. It will be readily understood that various modifications, substitutions and additions are possible without departing from the spirit and scope of the present disclosure. The scope of the present disclosure is not limited to the exemplary embodiments, but shall be defined by the appended claims.

What is claimed is:

1. A method for obtaining degradation of a battery, comprising:

collecting data of the battery and data related to the degradation of the battery, and processing the collected data to obtain parameters related to the degradation of the battery;

creating and updating a degradation model for the battery using the obtained parameters;

computing the degradation of the battery using the degradation model and the parameters related to the degradation;

creating an initial degradation model for the battery or updating the computed degradation model or calibrating the degradation model, based on the values of actually measured battery degradation and the obtained parameters related to the degradation;

storing successively the obtained parameters related to the degradation to form a degradation parameter log; and displaying when the battery has to be changed based on the degradation model, wherein the parameters related to the degradation comprises a quadrant parameter set of a parameter of the battery, a parameter of vehicle type and on-vehicle electronics, a parameter of traveled road condition, and a parameter of environment.

2. The method of claim 1, wherein the quadrant parameter set comprises data for battery ID, battery brand, battery model, battery type, battery quality, battery date of production, battery producer's prices, rated full charge amount, discharge current, discharge voltage, battery internal resistance, and ambient temperature.

3. A system for obtaining degradation of a battery, comprising:

a data collector configured to collect data of the battery and data related to the degradation of the battery, process the collected data to obtain parameters related to the degradation of the battery, and store the obtained parameters successively in a degradation parameter log;

a model creator and updater configured to create and update a degradation model for the battery with the obtained parameters, and to create an initial degradation model for the battery or update the computed degradation model or calibrate the degradation model, based on the values of actually measured battery degradation and the obtained parameters related to the degradation;

a degradation calculator configured to compute the degradation of the battery by using the degradation model and the obtained parameters related to the degradation; and a display configured to display when the battery has to be changed based on the degradation model, wherein the degradation model comprises a parameter of battery attribute, a parameter of battery charge/discharge, a parameter of battery use environment, and a parameter of vehicle.

* * * * *